US012578515B2

(12) United States Patent
Estevez Rodriguez et al.

(10) Patent No.: US 12,578,515 B2
(45) Date of Patent: Mar. 17, 2026

(54) METHOD FOR TREATING A MIRRORED OPTICAL ITEM

(71) Applicant: BNL EUROLENS, Montanges (FR)

(72) Inventors: Vincente Estevez Rodriguez, Montanges (FR); Laure Le Bihan, Montanges (FR)

(73) Assignee: BNL Eurolens, Bellegarde sur Valserine (FR)

( * ) Notice: Subject to any disclaimer, the term of this patent is extended or adjusted under 35 U.S.C. 154(b) by 672 days.

(21) Appl. No.: 17/916,279

(22) PCT Filed: Apr. 2, 2021

(86) PCT No.: PCT/EP2021/058793
§ 371 (c)(1),
(2) Date: Sep. 30, 2022

(87) PCT Pub. No.: WO2021/198507
PCT Pub. Date: Oct. 7, 2021

(65) Prior Publication Data
US 2023/0161086 A1 May 25, 2023

(30) Foreign Application Priority Data

Apr. 2, 2020 (FR) ...................................... 2003316

(51) Int. Cl.
*G02B 5/08* (2006.01)
*G02B 1/12* (2006.01)
(Continued)

(52) U.S. Cl.
CPC ............. *G02B 5/0816* (2013.01); *G02B 1/12* (2013.01); *G02B 1/14* (2015.01); *G02B 1/18* (2015.01);
(Continued)

(58) Field of Classification Search
USPC ........................................................ 359/838
See application file for complete search history.

(56) References Cited

U.S. PATENT DOCUMENTS 9,122,073 B2 * 9/2015 Macionczyk .......... G02B 1/113
2003/0129417 A1 7/2003 Chen et al.
(Continued)

FOREIGN PATENT DOCUMENTS

CN 1350185 5/2002
CN 103219343 7/2013
(Continued)

OTHER PUBLICATIONS

International Search Report and Written Opinion issued in Corresponding PCT Application No. PCT/EP2021/058793, dated Jun. 10, 2021 (English Translation provided).

*Primary Examiner* — Dung T Nguyen
(74) *Attorney, Agent, or Firm* — Norton Rose Fulbright US LLP

(57) ABSTRACT

The invention relates to a method for treating a mirrored optical item, comprising: a substrate (10), a mirroring stack (21) of at least two interference layers (M1 to M6) carried by the substrate (10), thus increasing the reflection and having: an interference layer (M1) distant from the substrate (10), with a first initial thickness and a first refractive index and at least one near interference layer (M2) arranged between the substrate (10) and the distant interference layer (M1), with a second thickness and a second refractive index different from the first refractive index, the mirroring stack (21) giving the mirrored optical ilem (1) a first colouring according to the CIELAB space, by means of an interferometry phenomenon, the method comprising a step (103) of removing, by ion bombardment, at least in one first predetemrined zone (Z1), a thickness of the mirrored stack that is less than the sum of the initial thicknesses concerned by the (Continued)

Figure 1A:
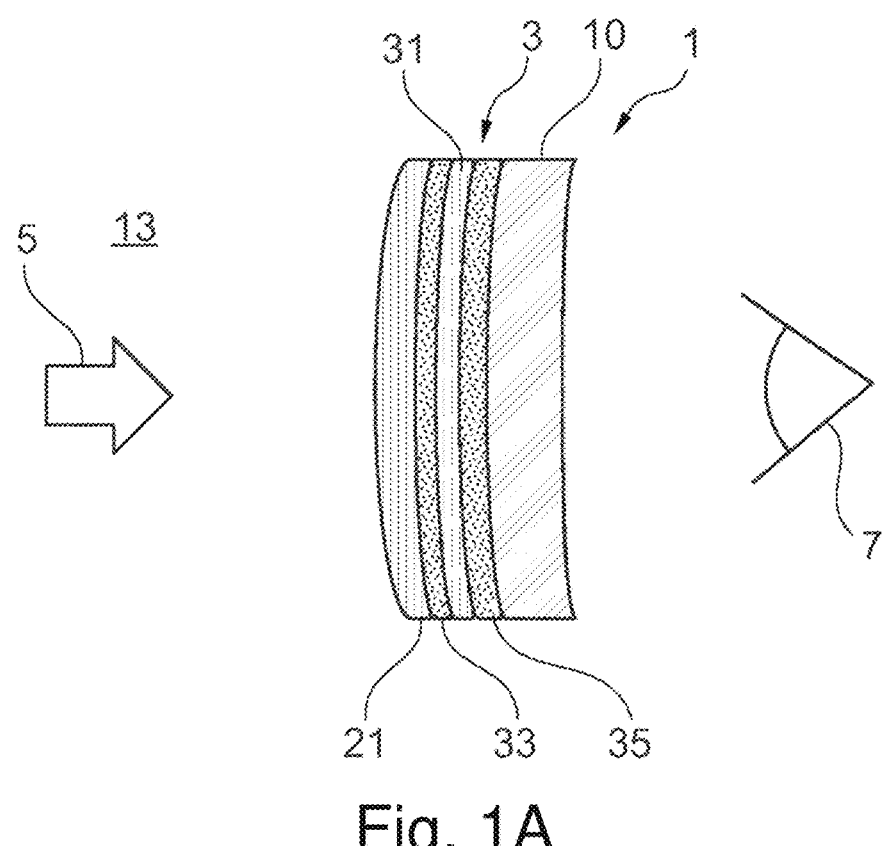

removal step, the mirrored optical item having, by means of an interferometry phenomenon, a second colouring according to the CIELAB space different from the first colouring.

15 Claims, 10 Drawing Sheets

(51) Int. Cl.
G02B 1/14 (2015.01)
G02B 1/18 (2015.01)
G02B 5/28 (2006.01)
*C23C 14/58* (2006.01)

(52) U.S. Cl.
CPC .......... G02B 5/286 (2013.01); *C23C 14/5833*
(2013.01)

(56) References Cited

U.S. PATENT DOCUMENTS

| | | | |
|---|---|---|---|
| 2005/0084626 A1 | 4/2005 | Ota et al. | |
| 2010/0102025 A1* | 4/2010 | Eagerton .................. | G02B 1/12 |
| | | | 216/13 |
| 2019/0250309 A1 | 8/2019 | Hsu et al. | |

FOREIGN PATENT DOCUMENTS

| | | |
|---|---|---|
| CN | 107111000 | 8/2017 |
| CN | 110431118 | 11/2019 |
| DE | 102011119598 | 5/2013 |
| EP | 2374032 | 10/2011 |
| EP | 3293565 | 3/2018 |
| WO | WO 2018/015650 | 1/2018 |

* cited by examiner

METHOD FOR TREATING A MIRRORED OPTICAL ITEM

CROSS-REFERENCE TO RELATED APPLICATIONS

This application is a national phase application under 35 U.S.C. § 371 of International Application No. PCT/EP2021/058793 filed 2 Apr. 2021, which claims priority to French Patent Application No. FR2003316 filed 2 Apr. 2020. The entire contents of each of the above-referenced disclosures is specifically incorporated by reference herein without disclaimer.

The invention relates to the field of treatment of optical articles, in particular mirror-effect ophthalmic lenses, and especially mirror-effect ophthalmic lenses coated with a multilayer interferential coating.

By optical article, what is meant in particular is a, corrective or non-corrective, lens that may be used as a spectacle lens, for example in glasses, in particular sunglasses or goggles or the like.

At the present time, optical articles, especially ophthalmic lenses and more specifically sunglasses, are not only intended to protect the eyes from the sun, but also have an esthetic aspect that is important to the wearer of these optical articles.

Thus, the spectacle wearer for example desires personalized optical articles that allow him to stand out through their exterior appearance, and especially their exterior appearance in terms of color and of reflectance. However, as is often the case in industry, personalization greatly increases the cost price of the articles produced and generally runs contrary to standardized production at lower cost price.

In the present case, a mirror-effect optical article, i.e. an optical article comprising a multilayer interferential coating, has a uniform external appearance.

To personalize such an optical article, it could for example be thought to modify, in certain regions, the thickness of one or more layers of the multilayer interferential coating using a pad-printing mask made of silicone. However, such a process lacks precision vis-a-vis outlines (problem with creep) and vis-a-vis repeatability. In addition, problems are observed with adhesion of layers subsequently deposited on the pad-printed regions and therefore an increase in scrappage is observed.

Laser engraving of certain layers of the multilayer interferential coating appears as a result to be a seductive alternative. However, such laser engraving may generate microcracks in the optical article that decrease the lifetime of the optical article. In addition, such engraving is not carried out under a controlled atmosphere and particles may be deposited on the optical article thus treated, subsequently leading to visual defects and for example an anti-smudge treatment may no longer adhere successfully.

Document WO2018015650 describes a process for marking optical articles in which laser ablation is used. DE10 2011 119598 describes a multilayer deposition process.

The object of the present invention is therefore to at least partially mitigate the aforementioned drawbacks by providing a process for treating a mirror-effect optical article comprising:

a substrate, a mirror stack of at least two interferential layers borne by the substrate thus increasing reflectance and having:

an interferential layer far from the substrate, with a first initial thickness and a first refractive index, and at least one near interferential layer placed between the substrate the and far interferential layer, with a second thickness and a second refractive index different from the first refractive index, the mirror stack giving, via an interference effect, a first color in the CIELAB space to the mirror-effect optical article, the process comprising a step of removing via ion bombardment at least from a first predetermined region a mirror-stack thickness that is smaller than the sum of the initial thicknesses concerned by the removing step, the mirror-effect optical article exhibiting, via an interference effect, a second color in the CIELAB space different from the first color.

Thus, using a standardized production process, it is possible to personalize a mirror-effect optical article in a very precise and repeatable way.

The process according to the invention may have one or more of the following aspects alone or in combination: In the step of removing via ion bombardment, the initial thickness of the far interferential layer may be decreased by a value smaller than its initial thickness. The mirror stack for example comprises two (exactly two) or at least three interferential layers, and the decrease in thickness of the far interferential layer is for example determined so that between the first and second colors, the difference in hue angle is smaller than 2% and the difference in chroma is larger than 10%.

The difference in lightness between the first and second colors is especially smaller than 10%, and more particularly smaller than 5%.

The $b^*/a^*$ ratio in the CIELAB space may be constant within a tolerance of 10%, and especially of 5%.

The decrease in thickness may be uniform in each of the predetermined regions.

Provision may be made for the step of removing via ion bombardment to be preceded by a step of determining an ion-bombardment time required to obtain the second color in the first predetermined region The step of removing via ion bombardment is especially such that the mirror-effect optical article exhibits, via an interference effect, a mirror effect having a reflectance in the first predetermined region different from a region not treated by the ion bombardment.

The mirror-effect article may comprise said first predetermined region and a region not treated by the ion bombardment, one of the two regions corresponding to a near-vision region with a mirror effect having a reflectance lower than in the other region, which corresponds to a far-vision region.

The area of the first predetermined region is for example smaller than the area of the mirror-effect optical article and the process may further comprise a second step of removing (additional removing step) via ion bombardment at least from a second predetermined region of the mirror-effect optical article that is different from the first predetermined region, in the second removing step a second predefined thickness of the far interferential layer is removed that is smaller than the first initial thickness of this far interferential layer and different from the thickness removed, in the first removing step, from the second predetermined region, the mirror-effect optical article exhibiting, via an interference effect, a third color in the CIELAB space different from the first and second colors in the CIELAB space.

The step of removing via ion bombardment may be carried out in a box-coater equipped with an ion gun.

In particular, a mask is placed between the mirror-effect optical article and the ion gun, preventing ions from reaching the interferential layers outside of the predetermined region.

The mask especially comprises an adhesive affixed to the mirror-effect optical article.

The mask may comprise a shield, especially a metal shield placed between the ion gun and the mirror-effect optical article.

The ion bombardment may be carried out under vacuum, or in an atmosphere containing an inert gas having a pressure lower than or equal to atmospheric pressure.

After the step of removing via ion bombardment, an anti-smudge treatment is especially applied to the entirety of the mirror-effect optical article.

The invention also relates to a mirror-effect optical article obtained with a process such as presented above and having at least two different colors in the CIELAB space.

The mirror-effect article in particular comprises said first predetermined region and a region not treated by the ion bombardment, one of the two regions corresponding to a near-vision region with a mirror effect having a reflectance lower than in the other region, which corresponds to a far-vision region.

Figure 1B:
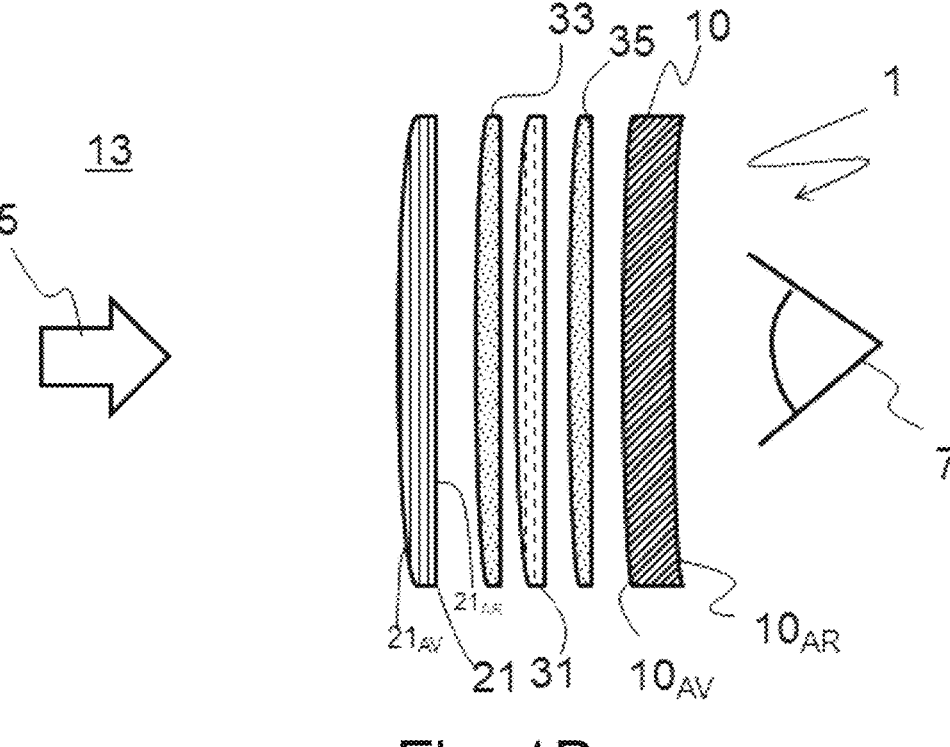
Figure 2:
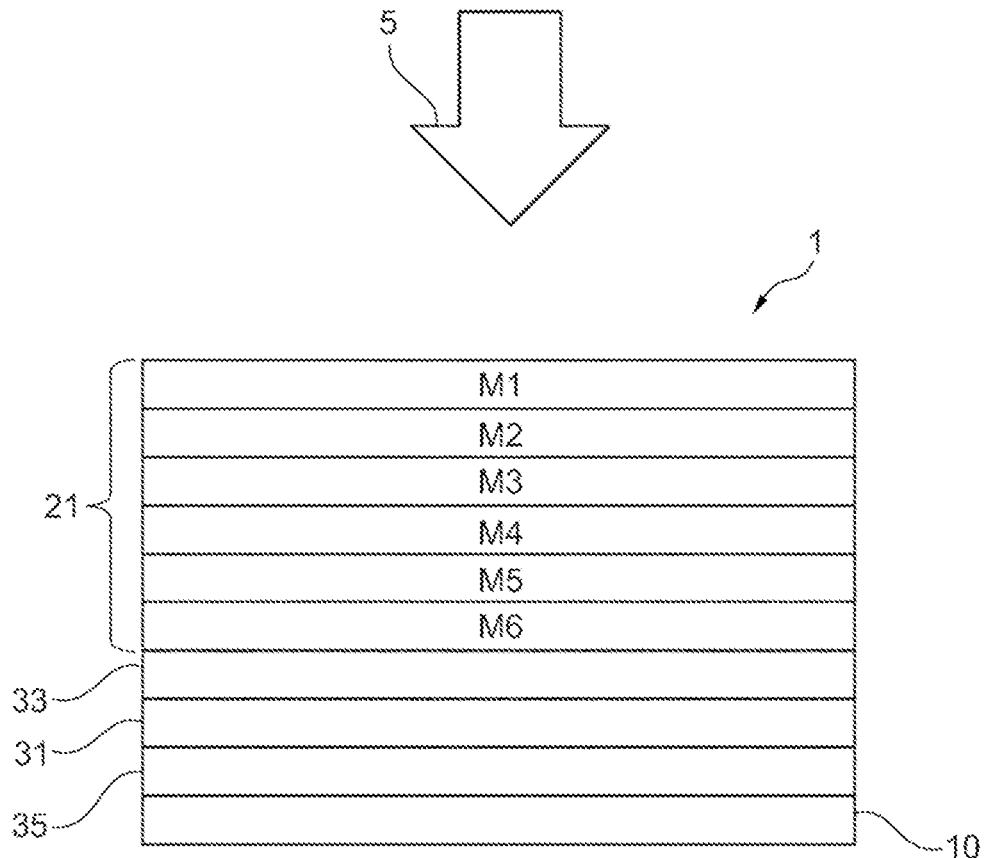
Figure 3:
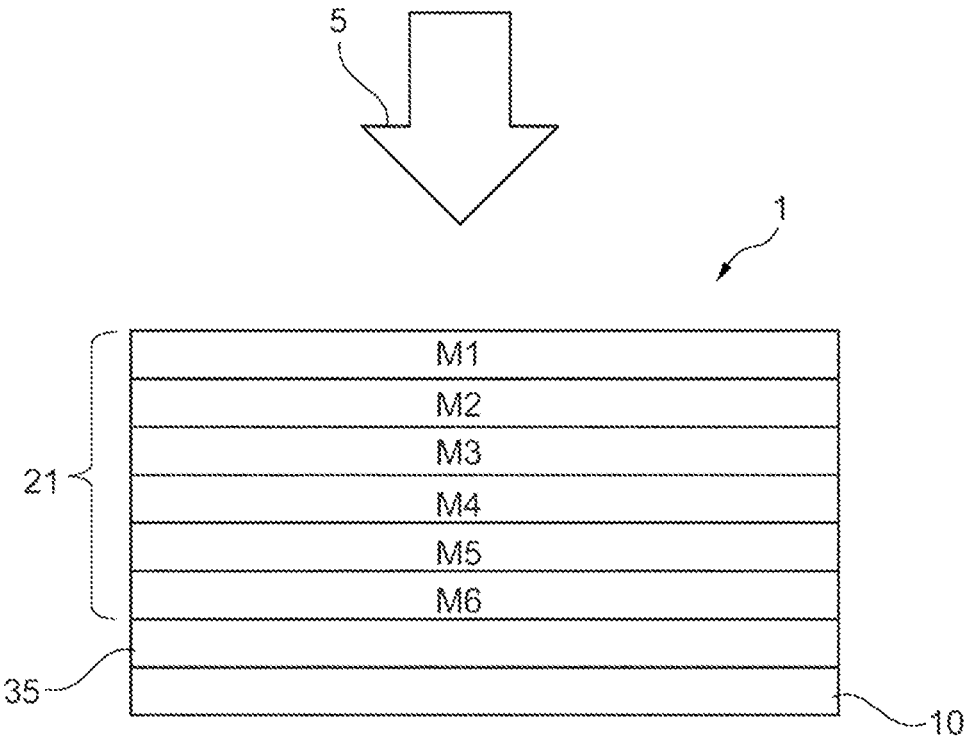
Figure 4:
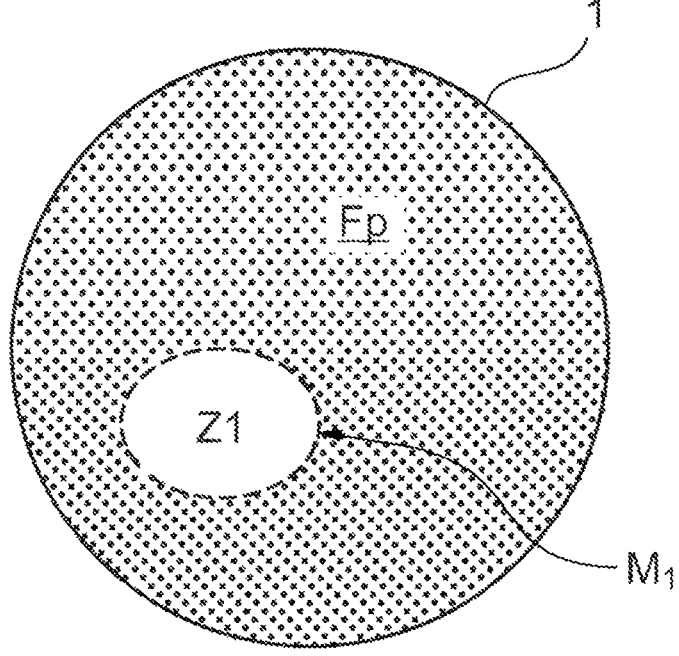
Figure 5:
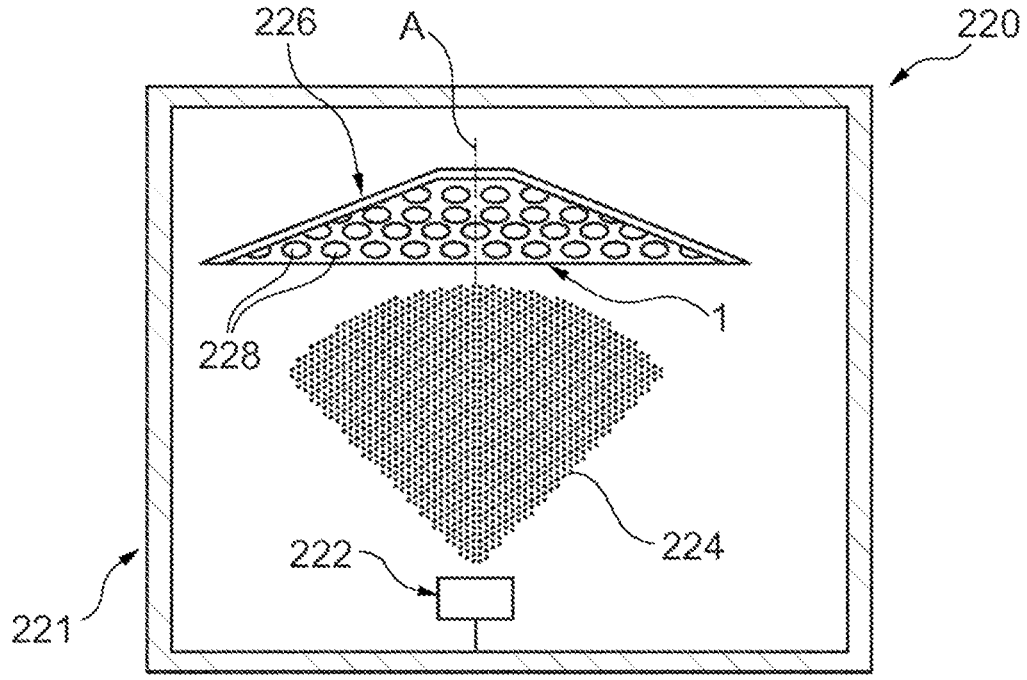
Figure 6:
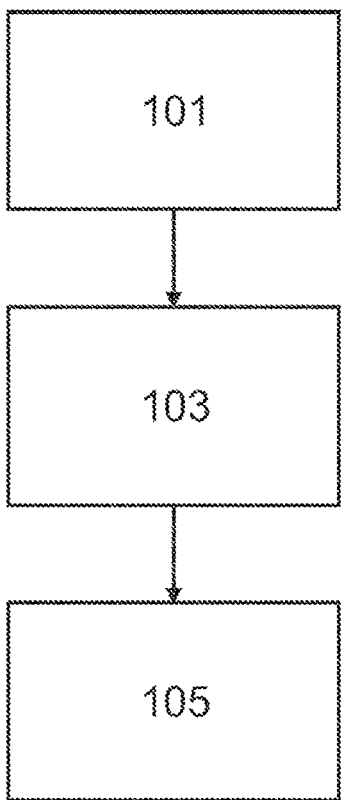
Figure 7:
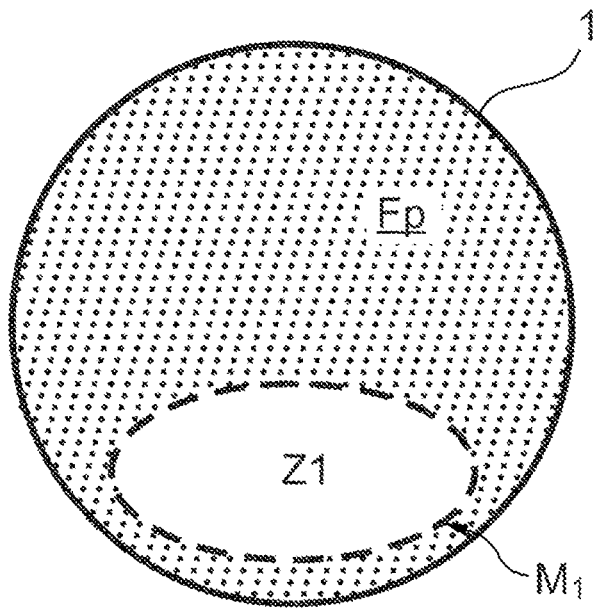
Figure 8:
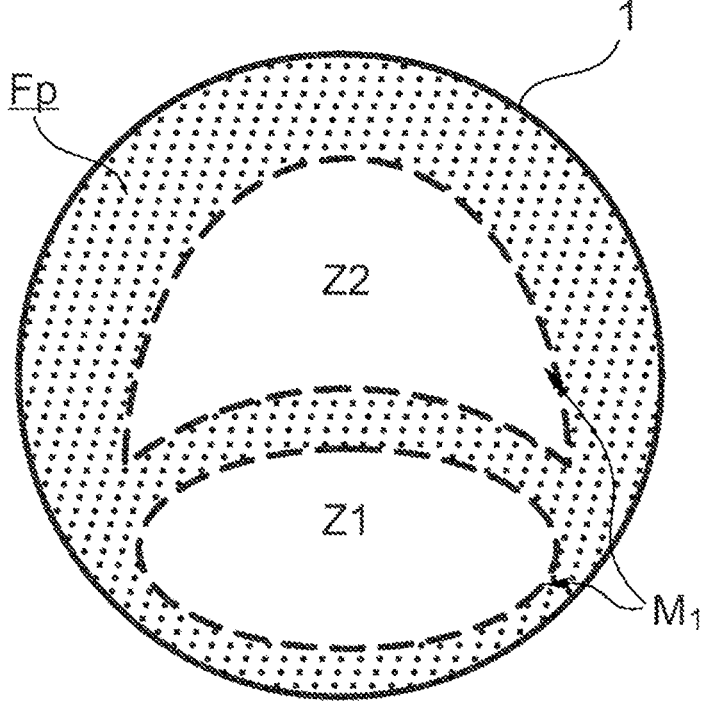
Figure 9:
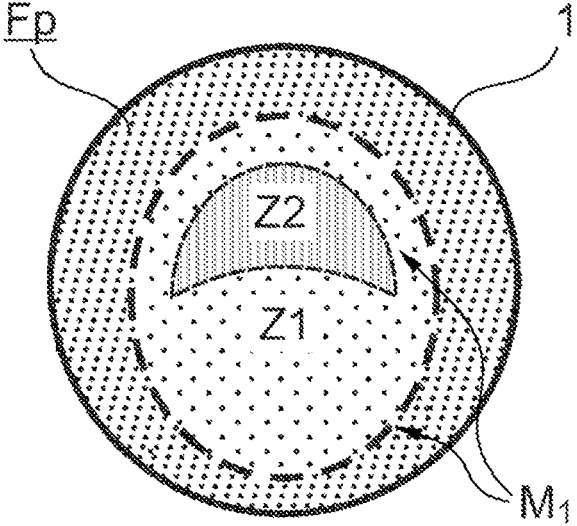
Figure 10:
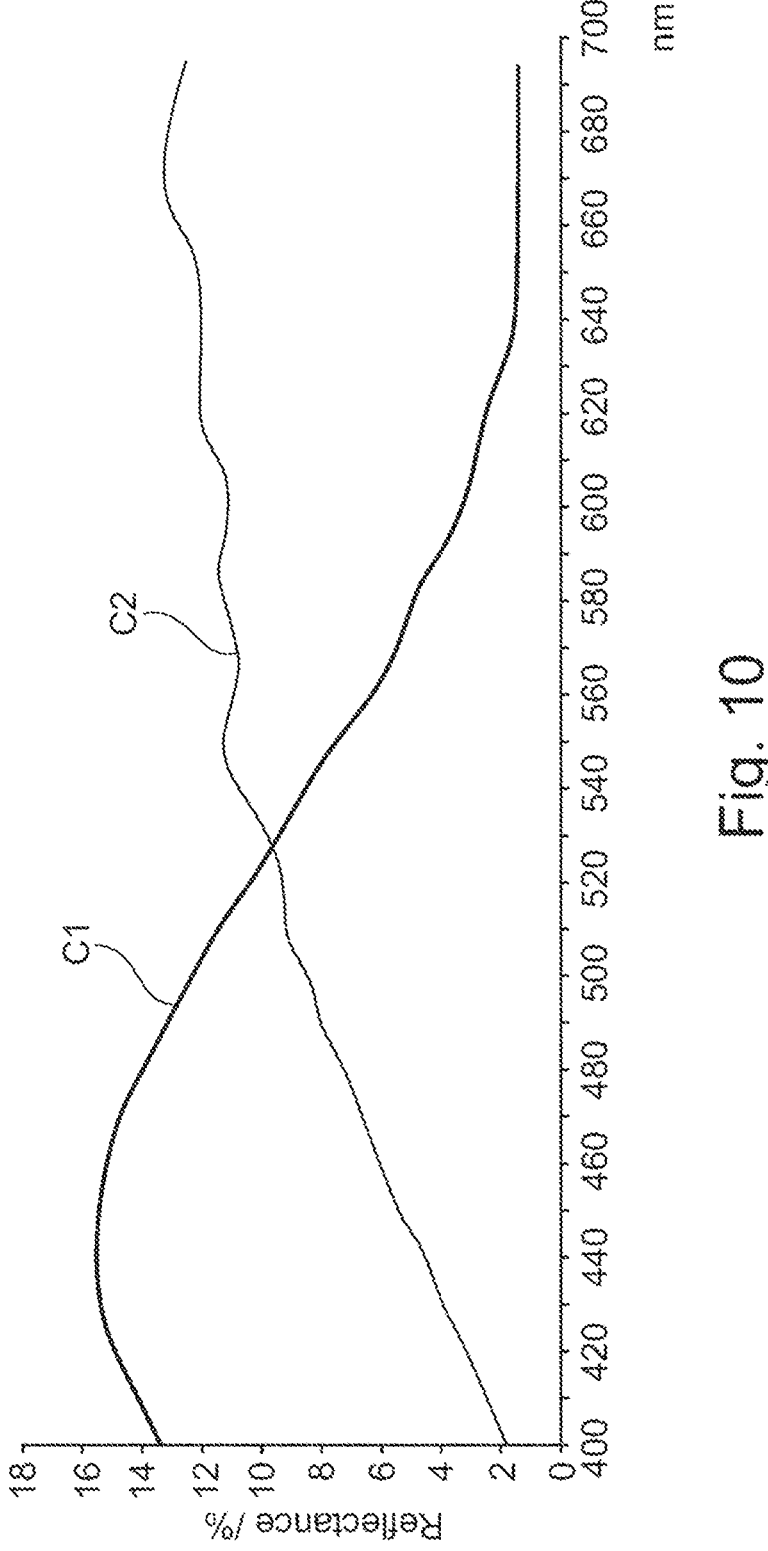

Other features and advantages of the invention will become more clearly apparent on reading the following description, which is given by way of illustrative and non-limiting example, and the appended figures, in which:

FIG. 1A schematically shows a mirror-effect optical article,

FIG. 1B shows the mirror-effect article of FIG. 1A exploded along its axis, artificially separating the various layers forming the mirror-effect article, FIG. 2 schematically shows a stack of layers of a mirror-effect optical article of FIGS. 1A and 1B according to a first embodiment, FIG. 3 schematically shows a stack of layers of a mirror-effect article according to a second embodiment, FIG. 4 shows face-on the mirror-effect optical article according to the examples of the embodiments of FIGS. 1A, 1B, 2 and 3, FIG. 5 is a simplified side-on schematic partially in cross section of a processing chamber that is capable of being employed to treat mirror-effect optical articles, FIG. 6 shows a flowchart of an example of implementation of the process for treating mirror-effect optical articles, FIG. 7 is a first variant of FIG. 4, FIG. 8 is a second variant of FIG. 4, FIG. 9 is a third variant of FIG. 4, FIG. 10 shows according to one example the reflectance of a region of a mirror-effect optical article before and after the treatment process has been carried out.

An example of one embodiment will now be described with reference to the figures. In all the figures, the same references have been used to designate elements that are the same.

Thus, from the examples of schematics of stacks of layers of FIGS. 2 and 3, figures similar to FIGS. 1A and 1B may easily be deduced by adding various layers thereto or removing various layers therefrom.

The following embodiments are examples. Although the description refers to one or more embodiments, this does not necessarily mean that each reference relates to the same embodiment, or that the features apply only to a single embodiment. Single features of various embodiments may also be combined to create other embodiments.

By "front" face or "rear" face of a layer, reference is being made to the propagation of light rays toward the eye. Thus, a "front" face is always the face that is nearest to the visual field of the user and a "rear" face is always the face that is nearest to the eye of the user.

By "upstream" or "downstream" of two elements or layers, reference is being made to the propagation of light rays toward the eye. Thus, a first element is placed "upstream" of a second element when light passes through, on its way toward the eye of the user, firstly the first element, then the second element. In contrast, a first element is placed "downstream" of a second element when light passes through, on its way toward the eye of the user, first the second element, then the first element. In the present description, the UV domain of the ultraviolet comprises wavelengths shorter than 380 nm. In the present description, the visible domain comprises wavelengths comprised between about 380 nm and about 800 nm, and especially wavelengths comprised between about 400 nm and 750 nm.

Reflectance is defined to be the average luminous reflectance $\rho_V$ in the visible domain such as defined in standard ISO 12311:2013 section 7.7:

The value of $\rho_V$ in percent is obtained by calculating the ratio of the light flux reflected by the filter $\Phi_R$ to the incident flux $\Phi_I$ as follows:

$$\rho_V = 100 \times \frac{\Phi_R}{\Phi_I} = 100 \times \frac{\int_{380}^{780} \rho(\lambda) \cdot V(\lambda) \cdot S_{D65}(\lambda) \cdot d(\lambda)}{\int_{380}^{780} V(\lambda) \cdot S_{D65}(\lambda) \cdot d(\lambda)}$$

where:
$\lambda$ is wavelength in nanometres;
$\rho(\lambda)$ is the spectral reflectance of the filter at the wavelength $\lambda$;
$V(\lambda)$ is the relative sensitivity of the human eye, such as defined in ISO 11664-1;
$S_{D65}(\lambda)$ is the spectral power distribution of CIE standard illuminant D65, such as defined in ISO 11664-2.

Hue angle and chroma are defined by standard NF ISO 11664-4:2011-07 section 4.2.

As known, a* and b* are CIELAB color coordinates.
Chroma is defined by:

$$C^*_{ab} = [(a^*)^2 + (b^*)^2]^{1/2}.$$

Hue angle is defined by: $h_{ab} = \arctan(b^*/a^*)$.

The hue angle must be comprised between 0° and 90° if a* and b* are both positive, between 90° and 180° if b* is positive and a* negative, between 180° and 270° if b* and a* are both negative and between 270° and 360° if b* is negative and a* positive.

Lightness is defined by BYK computation.

The expression "reflectance" is used and is defined by or to be equivalent to the average luminous reflectance such as defined above.

The mirror-effect optical article 1 of FIGS. 1A and 1B is for example intended to be used, especially as ophthalmic lens, in glasses, in particular sunglasses, or goggles. To do so, it is only necessary to trim the external edge 3 to the shape desired for the rim of a spectacle frame or of a pair of googles.

In FIGS. 1A and 1B, an arrow 5 representing the light incident on the mirror-effect article 1 and an eye 7 representing a user have been shown. The visual field 13 is therefore located on the side of the arrow 7 and the user looks through the mirror-effect optical article 1 with his eye 7.

By mirror-effect article 1, what is especially meant is a finished or semifinished, corrective or non-corrective lens able to be mounted in a frame, for example a spectacle frame, goggles or a visor intended to be placed in front of the eyes and forming a visual protective screen. The mirror-effect optical article 1 is the start product that will be subjected to the process described below.

The mirror-effect article 1 may be made of mineral glass or of organic glass or of a combination of both mineral glass and organic glass.

The mirror-effect optical article 1 may optionally be tinted, or have a tint gradient, and it may comprise, alone or in combination, other solar functions such as a polarizing function and/or a photochromic function as will be seen below. The mirror-effect optical article is for example of class 2, 3 or 4 according to standard ISO 12312.

It may also comprise other additional functions, whether alone or in combination, from the following non-exhaustive list: shock resistance, scratch resistance, wear resistance, anti-reflection, anti-smudge, anti-fog, antistatic. These additional functions may be produced using conventional methods (dip coating, vacuum deposition, spin coating, spray coating, etc.).

With reference to FIGS. 1A and 1B, the mirror-effect optical article 1 comprises a transparent substrate 10. This transparent substrate 10 has a rear face $10_{AR}$, which is intended to be oriented toward the eye 7 of the user, and which is intended to form the rear external surface of the mirror-effect article 1, i.e. the surface oriented toward the eye of the user, and a front face $10_{AV}$, which is oriented toward the visual field 13 of the user.

By transparent, what is meant is that a layer lets incident light completely or at least partially pass through. The transparent substrate 10 may be tinted, i.e. for example include colorants and/or pigments, or not.

More generally, the one or more materials of certain layers of the mirror-effect optical article 1 may be made of any material commonly used in the field of optics and in particular in the ophthalmic field.

It is for example possible to choose a thermoplastic from the following non-exhaustive group: polymethyl (meth) acrylate, polycarbonate, polycarbonate/polyester blends, polyamide, polyester, cyclic olefin copolymers, polyurethane, polysulfone, cellulose triacetate (CTA), polyimide, polyurethanes; polyethylene terephthalate and polymethyl methacrylate (PMMA); and copolymers and a combination thereof.

It is for example possible to choose a thermoset from the following non-exhaustive group: cellulose acetate butyrate (CAB), ethylene/norbornene copolymers or ethylene/cyclopentadiene copolymers; homo and copolymers of allylic carbonates of aliphatic or aromatic linear or branched polyols, such as homopolymers of diethylene glycol bis(allyl carbonate) (CR 39®); homo and copolymers of methacrylic acid and esters, which may be derivatives of bisphenol A; polymers and copolymers of thiomethacrylic acid and esters, (polymers and copolymers of urethane and thiourethane), (polymers and copolymers of epoxy), (polymers and copolymers of sulfides and episulfides) and combinations thereof.

To color the thermoplastic, it is possible to add pigments or colorants. Regarding pigments, the latter may be organic or mineral pigments.

The material of the substrate 10 is for example chosen from the group of the following materials: polymethyl (meth)acrylate, polycarbonate, polycarbonate/polyester blends, polyamide, polyester, cyclic olefin copolymers, polyurethane, polysulfone, cellulose triacetate (CTA) or cellulose acetate butyrate and a combination thereof.

The fact that the rear face $10_{AR}$ forms an external face does not prevent it from being treated for example with a scratch-resistant and/or anti-smudge and/or anti-reflection treatment.

A mirror stack 21 is placed upstream of the substrate 10. According to the embodiment of FIGS. 1A, 1B and 2, a polarizing assembly 31 for example comprising a polarizer film especially of polyvinyl alcohol (PVA) doped with iodide and stretched axially, which type of film is known for its polarizing properties, may be placed between the mirror stack 21, on the one hand, and the substrate 10, on the other hand, and fastened thereto by way of adhesive layers 33 and 35. In the polarizing assembly 31, the polarizer film may be sandwiched by two thin layers, especially made of thermoplastic material especially in order to protect the polarizer film. The polarizing assembly 31 may also be formed by a polarizer film alone. The polarizing assembly 31 is adhesively bonded to the rear face $21_{AR}$ of the mirror stack 21 and to the front face $10_{AV}$ of the substrate 10.

According to a first variant (not shown), an adhesion layer is placed between the polarizing assembly 31 and the substrate 10.

According to a second variant (not shown), a scratch-resistant layer is placed between the polarizing assembly 31 and the mirror stack 21.

Moreover, a varnish may be placed on the polarizing assembly 31 such that the varnish is located between the polarizing assembly 31 and the mirror stack 21.

If, in the polarizing assembly 31, the polarizer film is sandwiched by two thin layers, especially two thin layers made of thermoplastic, the downstream-most layer may also serve as an adhesion layer such as described above.

The mirror stack 21 is shown in more detail in FIG. 2. It for example comprises a succession of thin layers M1, M2, M3, M4, M5 and M6. Adjacent thin layers have a refractive index that is different one from the other. However, two non-adjacent thin layers may have refractive indices that are identical to each other.

The layer M1 is the interferential layer that is far from the substrate 10 with a first initial thickness $e_{1\text{-}init}$ and a first refractive index $n_1$.

The layers M2 to M6 are near interferential layers, placed between the substrate 10 and the far interferential layer M1, each with an initial thickness $e_{j\text{-}init}$ and a refractive index $n_j$ (j being a whole number from 2 to 6 in the present example).

In particular, the layer M2 has a second initial thickness $e_{2\text{-}init}$ and a refractive index $n_2$ that is different from the first refractive index $n_1$.

The mirror stack 21 gives, via an interference effect, a first color in the CIELAB space to the mirror-effect optical article 1, of course in concert with the layers located further downstream in the direction of the eye of the user 7. The number, the indices and thicknesses of of the layers the stack are predetermined experimentally, by calculation or by means of a computer or simulator so as to obtain said first color with a predetermined reflectance.

Of course, the number of thin layers $M_j$ may vary and there may for example be only two, four or eight layers.

The first thin layers M1, M3 and M5 are for example made of silica ($SiO_2$) and the second thin layers M2, M4 and M6 are for example made of titanium oxide ($Ti_3O_5$).

Other materials may be chosen, for example so that in the visible domain, the first thin layers M1, M3 and M5 have a first refractive index $n_1$ lower than or equal to 1.5, and the second thin layers M2, M4 and M6 have a second refractive index $n_2$ higher than 2 and especially equal to or higher than 2.3.

Generally, the first thin layers M1, M3 and M5 possess a thickness comprised between 70 nm and 250 nm, and the second thin layers M2, M4 and M6 have a thickness comprised between 40 nm and 80 nm.

According to a very concrete example the mirror stack 21 is formed in the following way:

| Thin layer | Material | Thickness $e_j$ (nm) |
|---|---|---|
| M1 | $SiO_2$ | 76.38 |
| M2 | $Ti_2O_3$ | 58.21 |
| M3 | $SiO_2$ | 169.72 |
| M4 | $Ti_2O_3$ | 61.57 |
| M5 | $SiO_2$ | 165.73 |
| M6 | $Ti_2O_3$ | 71.86 |

As may be seen in FIG. 2, the first thin layers M1, M3 and M5 and the second thin layers M2, M4 and M6 are therefore arranged in alternation.

The mirror stack 21 is typically produced by vacuum deposition of thin layers in a box-coater.

As a result a polarizing assembly 31 for example comprising a polarizer film is adhesively bonded to the second thin layer M6 and to the front face 10ay of the substrate 10.

The embodiment of FIG. 3 only differs from that of FIG. 2 in that provision is not made in this embodiment for a polarizer assembly 31. The substrate 10 is then fastened downstream of the rear face $21_{AR}$ of the mirror stack 21.

Provision may be made to fasten the substrate 10 to the rear face $21_{AR}$ of the mirror stack 21 with an adhesive 35.

According to one variant (not shown) an adhesion layer, especially one made of thermoplastic, may be placed between the mirror stack 21 and the substrate 10.

According to one embodiment (not shown) provision may be made to replace the polarizing assembly 31 with a photochromic layer that is activatable in the UV domain and/or in the visible domain.

This photochromic layer may be a thermoplastic comprising a known photochromic dye. The following families, which are commonly used in ophthalmic lenses, will simply be mentioned by way of example: the spiro-oxazines, the spiro-indoline[2,3']benzoxazines, the chromenes, the homo-aza-adamantane spirooxazines, the spirofluorene-(2H)-benzopyrans, the naphtho[2,1-b]pyrans and the naphtho[1,2-b] pyrans.

FIG. 4 shows face-on, i.e. in the direction of the arrow 5, the mirror-effect optical article 1 according to the examples of embodiments of the preceding figures. In this figure, a first region Z1 to which the treatment of the process according to the invention will be applied has been drawn with dashed lines. In the present example, the region Z1 is smaller than the mirror-effect optical article 1 is in area. Its extent is therefore smaller than the diameter of the mirror-effect optical article 1.

The not treated regions/region, which are located outside of the first region Z1, are protected, for example by at least one protective adhesive film Fp that is applied to the thin layer M1 before the treatment process is carried out. Thus, this FIG. 4 shows the protective film Fp and the layer M1 of the mirror stack 21 in the region Z1.

According to another example, the region Z1 covers all of the mirror-effect article 1, which will therefore, following the treating process, change exterior appearance and especially color.

According to yet another example, provision may be made for a plurality of regions, for example Z1, Z2, etc., as will be seen below.

To this end, the mirror-effect optical article 1 is for example placed in a tool 220 that allows mirror-effect optical articles 1 to be treated by ion bombardment.

This tool 220 comprises a processing chamber 221 and an emitting source 222 that emits ions for bombarding the PCT/EP2021/058793 WO 2021/198507-16-mirror-effect optical articles 1 in an evaporation cone 224 for example.

The processing chamber 221 may be hermetically sealed and be connected to a vacuum generator (not shown), for example a vacuum pump, with a view to decreasing the pressure inside the processing chamber 221 to a pressure suitable for the treatment to be applied, and typically for example of the order of $3\times10-5$ mbar.

Alternatively, the ion bombardment may be carried out in an atmosphere containing an inert gas having a pressure lower than or equal to atmospheric pressure.

The emitting source 222 for example consists of an ion gun or a holder on which is placed a material to be evaporated, an ion source or a plasma generator, and for example of a crucible or a target, and, to evaporate it, the material is for example subjected to Joule heating, to electron bombardment, or to a cathode-sputtering effect. The ion source may be a tungsten filament forming a cathode. The gas diffuser or plasma generator may be formed by a graphite anode. In this case, a crucible or a target are not necessary for such an emitting source 222.

A rotary holder 226 for the mirror-effect optical articles 1 is placed above the emitting source 222.

To this end, the rotary holder 226 comprises individual housings 222 for the mirror-effect optical articles 10. The individual housings 228 are for example arranged on concentric tracks.

It will be understood that when the holder 226 is rotated, each of the individual housings 228 makes 360° rotations. The rotary holder 226 for example has a concave shape or more specifically a skull-cap shape so that the individual housings 228 of the mirror-effect optical articles 1 are located at equal distance from the ion-emitting source 222.

The rotary holder 226 may rotate about an axis A that corresponds to the axis of symmetry of the rotary holder and that passes through the center thereof, this allowing the uniformity of the exposure of the mirror-effect optical articles to the ion bombardment to be increased. The tool 220 is for example a box-coater equipped inter alia with an ion gun and that also allows other treatments to be applied, especially treatments for finishing the mirror-effect optical article 1, such as an anti-smudge treatment. As mentioned above, the box-coater may also be used to produce the mirror stack 21.

The tool 220 therefore makes it possible to carry out, in the same machine, various steps in the manufacture of an optical article and in particular even certain steps that come before those concerned by the process of the invention.

Before being introduced into the tool 222, the one or more regions of the mirror-effect optical article 1 that must not be treated are therefore protected by a shield, the adhesive film Fp for example.

Alternatively, instead of the protective film Fp, provision may be made in the tool 220 for a mask, in particular a shield, especially one made of metal, between the mirror-effect optical article 1 and the ion gun, preventing the ions from reaching the interferential layers outside of the predetermined region Z1.

The process comprises a first step 103 (see FIG. 6) consisting in removing via ion bombardment at least in a first predetermined region Z1 a thickness et of the mirror stack 21 that is smaller than the sum of the initial thicknesses concerned by the removing step.

More specifically, the treatment process aims to remove a thin layer $M_j$ only partially and where appropriate the one or more thin layers $M_i$ to $M_{j-1}$ furthest from the substrate 10 completely. In the terms of the present application, for i<j, the layer $M_i$ is further from the substrate 10 than the layer $M_j$.

For example, according to a first embodiment, the tool 220 is configured to remove from the thin layer M1 a thickness $e_t < e_{1-init}$, i.e. the initial thickness $e_{1-init}$ of the far interferential layer M1 is decreased by a value et smaller than its initial thickness $e_{1-init}$. A residual thickness of the layer M1 $e_r = e_{1-init} - e_t$ will therefore be obtained. This example will generally be most relevant in the case where the mirror stack 21 possesses two or more than three thin interferential layers $M_j$.

More generally, if one portion of the layer $M_k$ (k being an integer, in the present example k=1 to 6, and preferably k=1 or 2) is removed, a thickness defined by the following equation is removed by ion bombardment from the predetermined region Z1:

$$e_t < \sum_{j=1}^{j=k} e_{j-init}.$$

The layer Mk will therefore possess a residual thickness $$e_r = e_{k-init} - e_t + \sum_{j=1}^{j=k-1} e_{j-init}.$$

For example, provision may be made for the residual thickness $e_r$ of the layer Mk to be comprised in the range $0.05\ e_{k-init} < e_r < 0.95\ e_{k-init}$.

Thus, the mirror-effect optical article 1 has, in this predetermined region Z1, via an interference effect, a second color in the CIELAB space different from the first color of the not treated mirror-effect optical article 1 or of the not treated regions of the mirror-effect article 1.

The advantage of proceeding thus lies in the precision of the process for removing a certain thickness and in its repeatability on the industrial scale, this therefore allowing a predictable and high-quality result in terms of second color to be obtained.

According to one example, in the case where the mirror stack 21 comprises at least three interferential layers (as for example in the example of FIGS. 2 and 3) and the ion bombardment removes only some of the thin layer M1, the decrease in thickness et of the far interferential layer M1 is determined so that, between the first and second colors, the difference in hue angle is smaller than 2% and the difference in chroma is larger than 10%.

According to another example, the decrease in thickness et of the far interferential layer M1 is determined so that the difference in lightness between the first and second colors is smaller than 10%, and especially smaller than 5%.

According to yet another example, the decrease in thickness et of the far interferential layer M1 is determined so that the ratio b*/a* in the CIELAB space is constant within a tolerance of 10%, and especially of 5%, between the first and second colors.

After this first step 103, the decrease in thickness is observed to be uniform in the or in each of the predetermined regions Zi.

According to one variant, step 103 is preceded by an optional step 101 of determining an ion-bombardment time T required to obtain the second color in the first predetermined region Z1.

According to another example, the decrease in thickness et of the far interferential layer M1 is determined such that the mirror-effect optical article 1 exhibits, via an interference effect, a mirror effect having a reflectance in the first predetermined region Z1 different from a region not treated by the ion bombardment.

In FIG. 7, which is a variant of FIG. 4, the mirror-effect optical article comprises said first predetermined region Z1 and a region not treated by the ion bombardment, which region is protected by the protective film Fp, and one of the two regions, here the region Z1, corresponds to a near-vision region with a mirror effect having a reflectance lower than in the other region (the region not treated), which corresponds to a far-vision region. According to another variant shown in FIG. 8 in which the area of the first predetermined region Z1 is smaller than the area of the mirror-effect optical article 1, the process may further comprise a second step 105 of removing via ion bombardment at least from a second predetermined region 22 of the mirror-effect optical article 1 that is different from the first predetermined region Z1. In this second removing step 105, the region Z1 may be protected, for example by an additional adhesive film Fp, and a second predefined thickness of the far interferential layer M1 is removed that is smaller than the first initial thickness of this far interferential layer and different from the thickness removed in the first removing step 103. As a result thereof, in the second predetermined region Z2, the mirror-effect optical article 1 exhibits, via an interference effect, a third color in the CIELAB space different from the first and second colors in the CIELAB space. A three-color mirror-effect optical article is therefore obtained.

According to yet another variant shown in FIG. 9, in which the area of the first predetermined region Z1 is smaller than the area of the mirror-effect optical article 1, the process may further comprise a second step 105 of removing via ion bombardment at least from a second predetermined region Z2 of the mirror-effect optical article 1, said second predetermined region Z2 being included in the first predetermined region Z1 and being smaller than the latter.

In the second removing step 105, an adhesive protective film Fp protects all the mirror-effect optical article except the predetermined region Z2 and a predefined second thickness of the far interferential layer M1 is removed that is smaller than the difference between the first initial thickness of this far interferential layer and the thickness removed in the first removing step. In the second predetermined region, the mirror-effect optical article 1 therefore exhibits, via an interference effect, a third color in the CIELAB space different from the first and second colors in the CIELAB space.

It will therefore be understood that the process for treating the mirror-effect optical article 1 allows certain parameters, and especially color, to be changed precisely and repeatedly with a view to obtaining a personalized product with a contained cost price.

FIG. 10 for example shows the reflectance as a function of wavelength of a mirror-effect optical article 1 in the predetermined region Z1 before (curve C1) and after (curve C2) step 103 of the treatment process. Before the treatment, in step 103, the mirror-effect optical article 1 has in its entirety and more specifically in the predetermined region Z1 a "blue" appearance, whereas the predetermined region Z1 has a "bronze" appearance after treatment, as the spectra of FIG. 10 show. Starting with a mirror-effect optical article 1 of a predetermined color, a mirror-effect optical article of another color or having two, or even three different colors, is obtained. According to some examples, the change in color may be less pronounced and result for example in a "pastel" effect.

Moreover, by inspecting a mirror-effect optical article treated according to the process described above, especially using an electron microscope, it may be observed that a thickness of the mirror stack has been removed by ion bombardment from a predetermined region. In particular, in a predetermined region Z1 for example, the layers that underwent the ion bombardment may be observed to have densified with respect to a region in which the layers were not subject to ion bombardment.

The invention claimed is:

1. A process for treating a mirror-effect optical article comprising:
  a substrate;
  a mirror stack of at least two interferential layers borne by the substrate thus increasing reflectance and having:
    an interferential layer far from the substrate, with a first initial thickness and a first refractive index, and
    at least one near interferential layer placed between the substrate and the far interferential layer, with a second thickness and a second refractive index different from the first refractive index,
the mirror stack giving, via an interference effect, a first color in the CIELAB space to the mirror-effect optical article,
the process comprising a step of removing via ion bombardment at least from a first predetermined region a mirror-stack thickness that is smaller than the sum of the initial thicknesses concerned by the removing step, the mirror-effect optical article exhibiting, via an interference effect, a second color in the CIELAB space different from the first color.

2. The process as claimed in claim 1, wherein, in the step of removing via ion bombardment, the initial thickness of the far interferential layer is decreased by a value smaller than its initial thickness.

3. The process as claimed in claim 2, wherein the mirror stack comprises two or at least three interferential layers, and wherein the decrease in thickness of the far interferential layer is determined so that between the first and second colors, the difference in hue angle is smaller than 2% and the difference in chroma is larger than 10%.

4. The process as claimed in claim 2, wherein the difference in lightness between the first and second colors is smaller than 10%.

5. The process as claimed in claim 2, wherein the b*/a* ratio in the CIELAB space is constant within a tolerance of 10%.

6. The process as claimed in claim 1, wherein the decrease in thickness is uniform in each of the predetermined regions.

7. The process as claimed in claim 1, wherein the step of removing via ion bombardment is preceded by a step of determining an ion-bombardment time required to obtain the second color in the first predetermined region.

8. The process as claimed in claim 1, wherein the step of removing via ion bombardment is such that the mirror-effect optical article exhibits, via an interference effect, a mirror effect having a reflectance in the first predetermined region different from a region not treated by the ion bombardment.

9. The process as claimed in claim 1, wherein the mirror-effect article comprises said first predetermined region and a region not treated by the ion bombardment, one of the two regions corresponding to a near-vision region with a mirror effect having a reflectance lower than in the other region, which corresponds to a far-vision region.

10. The process as claimed in claim 1, wherein the area of the first predetermined region is smaller than the area of the mirror-effect optical article and wherein the process further comprises a second step of removing via ion bombardment at least from a second predetermined region of the mirror-effect optical article that is different from the first predetermined region, in the second removing step a second predefined thickness of the far interferential layer is removed that is smaller than the first initial thickness of this far interferential layer and different from the thickness removed, in the first removing step, from the second predetermined region, the mirror-effect optical article exhibiting, via an interference effect, a third color in the CIELAB space different from the first and second colors in the CIELAB space.

11. The process as claimed in claim 1, wherein a mask is placed between the mirror-effect optical article and an ion gun, preventing ions from reaching the interferential layers outside of the predetermined region.

12. The process as claimed in claim 1, wherein the ion bombardment is carried out under vacuum, or in an atmosphere containing an inert gas having a pressure lower than or equal to atmospheric pressure.

13. The process as claimed in claim 1, wherein, after the step of removing via ion bombardment, an anti-smudge treatment is applied to the entirety of the mirror-effect optical article.

14. A mirror-effect optical article obtained with a process as claimed in claim 1 and having at least two different colors in the CIELAB space.

15. The mirror-effect optical article as claimed in claim 14, wherein the mirror-effect article comprises said first predetermined region and a region not treated by the ion bombardment, one of the two regions corresponding to a near-vision region with a mirror effect having a reflectance lower than in the other region, which corresponds to a far-vision region.

* * * * *